(12) United States Patent
Yamabuchi et al.

(10) Patent No.: US 7,333,331 B2
(45) Date of Patent: Feb. 19, 2008

(54) POWER UNIT DEVICE AND POWER CONVERTER DEVICE

(75) Inventors: Hiroshi Yamabuchi, Tokyo (JP); Yuji Kuramoto, Tokyo (JP); Toru Kimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 31 days.

(21) Appl. No.: 11/346,368

(22) Filed: Feb. 3, 2006

(65) Prior Publication Data

US 2006/0250765 A1   Nov. 9, 2006

(30) Foreign Application Priority Data

Apr. 22, 2005   (JP)   ............................ P2005-124457

(51) Int. Cl.
*H05K 7/20*   (2006.01)
(52) U.S. Cl. ................. 361/699; 361/698; 361/702; 165/80.3; 165/80.4; 257/706; 257/714; 363/141; 363/144
(58) Field of Classification Search ................ 361/688, 361/689, 699–707, 710, 715, 784, 785; 165/80.2, 165/80.3, 80.4, 104.33; 62/259.2; 257/713, 257/714, 722, 723; 363/141, 144–147, 65; 174/15.1, 16.1, 16.3, 252; 318/139, 801, 318/802, 812
See application file for complete search history.

(56) References Cited

U.S. PATENT DOCUMENTS

| | | | | |
|---|---|---|---|---|
| 5,574,312 A | * | 11/1996 | Bayerer et al. | ............. 257/706 |
| 5,623,399 A | * | 4/1997 | Ishii et al. | ................... 363/132 |
| 5,963,442 A | * | 10/1999 | Yoshida et al. | ............... 363/98 |
| 6,501,653 B1 | * | 12/2002 | Landsgestell et al. | ........ 361/699 |
| 6,661,659 B2 | * | 12/2003 | Tamba et al. | ............... 361/699 |
| 6,762,937 B2 | * | 7/2004 | Kimoto et al. | .............. 361/699 |
| 7,030,520 B2 | * | 4/2006 | Takenaka et al. | ............. 310/64 |
| 7,057,275 B2 | * | 6/2006 | Schwarzbauer et al. | .... 257/706 |
| 7,212,407 B2 | * | 5/2007 | Beihoff et al. | .............. 361/699 |

FOREIGN PATENT DOCUMENTS

| | | | |
|---|---|---|---|
| JP | 2004-297847 A | | 10/2004 |
| SU | 1372426 A | * | 2/1988 |

\* cited by examiner

*Primary Examiner*—Michael Datskovskiy
(74) *Attorney, Agent, or Firm*—Sughrue Mion, PLLC

(57) ABSTRACT

A power unit device which can be made small, with which special measures of plant and labor at the time of assembly are unnecessary, and of which assembly is easy and universality in its manufacturing aspect is excellent. The power unit device has a heat sink having a first heat-receiving part and formed on the opposite side from this a second heat-receiving part; a power module, in firm contact with the first heat-receiving part, containing a power semiconductor element for performing DC-AC conversion and/or AC-DC conversion for one phase; a smoothing condenser, in firm contact with the second heat-receiving part, for suppressing ripple current of the power semiconductor element; and fixing means passing through the power module, the heat sink and the smoothing condenser.

18 Claims, 4 Drawing Sheets

(a)

(b)

(c)

POWER UNIT DEVICE AND POWER CONVERTER DEVICE

BACKGROUND OF THE INVENTION

1. Field of the Invention

This invention relates to a power unit device and a power converter device that can be suitably used for example as control devices of an AC motor mounted in a fuel cell car or a hybrid car.

2. Description of the Related Art

An inverter device for drive-controlling a motor in for example a hybrid vehicle using both an internal combustion engine and batteries or an electric vehicle using a DC power source such as batteries or fuel cells has as main constituent parts a power semiconductor element for converting power, a circuit board for controlling this, and a smoothing condenser and a heat sink, and technology is known wherein to make an assembly of these parts compact a number of power modules each containing inside it a power semiconductor element for converting power are disposed on a face orthogonal to a motor axis and this face is made a heat sink for dissipating heat produced by the power module and thereby cooling it (see for example Patent Document 1).

Patent Document 1: JP-A-2004-297847 (page 1, FIG. 1)

In this related art, because multiple power modules are mounted on a single heat sink, the heat sink becomes large, and compared to the relatively small power modules and peripheral constituent members the heat sink becomes excessive in size and weight, at the time of assembly just because of the heat sink the production line becomes long and non-standard special measures become necessary like having to strengthen its load-bearing capacity, and there has been the issue that in electrical equipment manufacturing sites where space restrictions are severe and the object is light work this can become a problem.

The present invention was made to solve problems of related art of the kind described above, and it is an object of the invention to provide a power unit device which can be made small, with which special measures of plant and labor at the time of assembly are unnecessary, and of which assembly is easy and universality in the manufacturing aspect is excellent.

SUMMARY OF THE INVENTION

The invention provides a power unit device including: a heat sink having a first heat-receiving part and, formed on the opposite side from this, a second heat-receiving part; a power module, firmly in contact with the first heat-receiving part, containing a power semiconductor element for performing DCAC conversion and/or ACDC conversion for one phase; a smoothing condenser, in firm contact with the second heat-receiving part, for suppressing ripple current of the power semiconductor element; and fixing means for integrating the power module, the heat sink and the smoothing condenser together.

In this invention, because a power module, containing power semiconductor elements for one phase, and a smoothing condenser are both mounted on a first heat-receiving face and a second heat-receiving face of a heat sink and fixed in the form of a stack by fixing means, the power unit device obtained can be made small, and special measures of plant and labor at the time of assembly are unnecessary. And, the content of existing electrical equipment assembly plant and so on can also be observed, and universality in the manufacturing aspect is excellent.

And, when an efficient multi-phase motor such as an ordinary 3-phase motor is to be controlled, multiple power unit devices can be provided in correspondence with the number of phases required, they can be disposed in conformity with the available space, and the freedom of layout increases. Also, by a heat sink being in firm contact individually with each of the power modules, which are sources of heat production, the cooling effect can be made uniform among phases, and by the power unit devices being disposed with a uniform angular spacing or uniform straight-line spacing, the occurrence of surge voltages can also be made uniform among phases.

DETAILED DESCRIPTION OF THE PREFERRED EMBODIMENTS

First Preferred Embodiment

Figure 1:
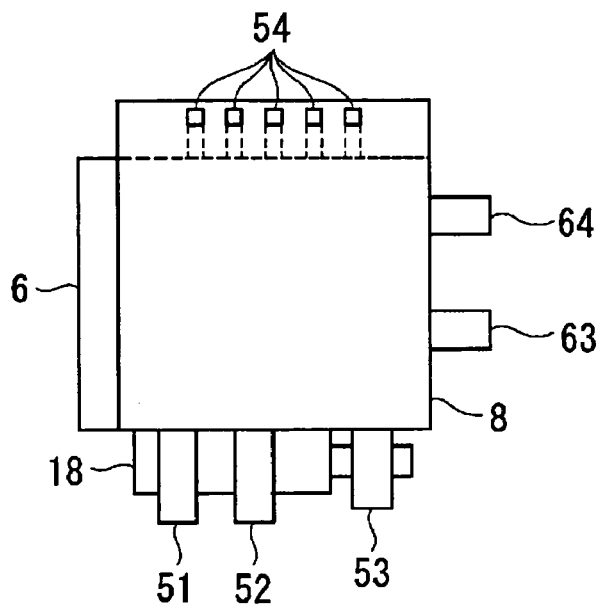
FIGS. 1A through 1C show schematically the exterior of a power unit device according to a first preferred embodiment of the invention, FIG. 1A being a plan view, FIG. 1B a front view and FIG. 1C a side view.
Figure 1:
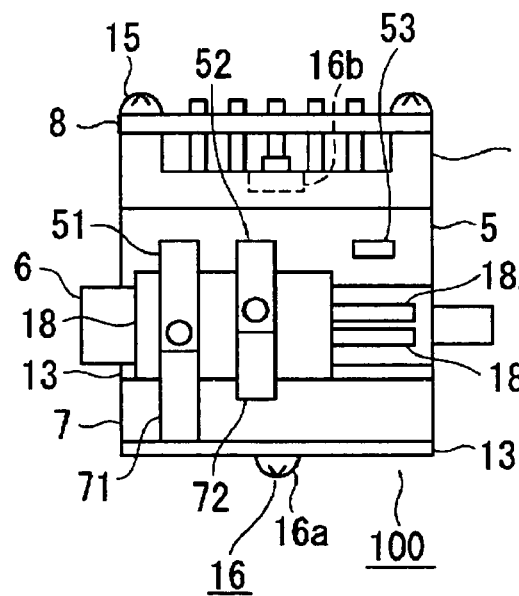
Figure 1:
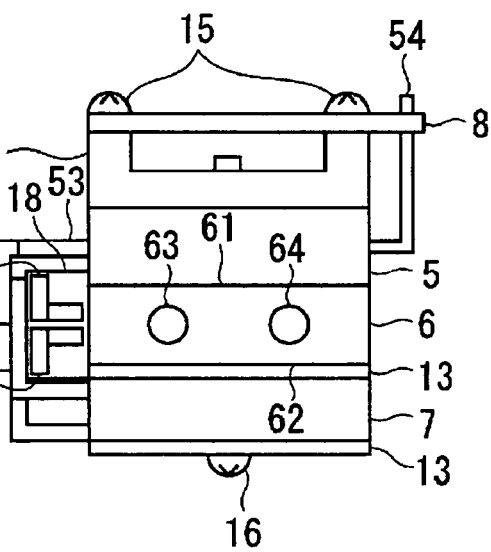
Figure 2:
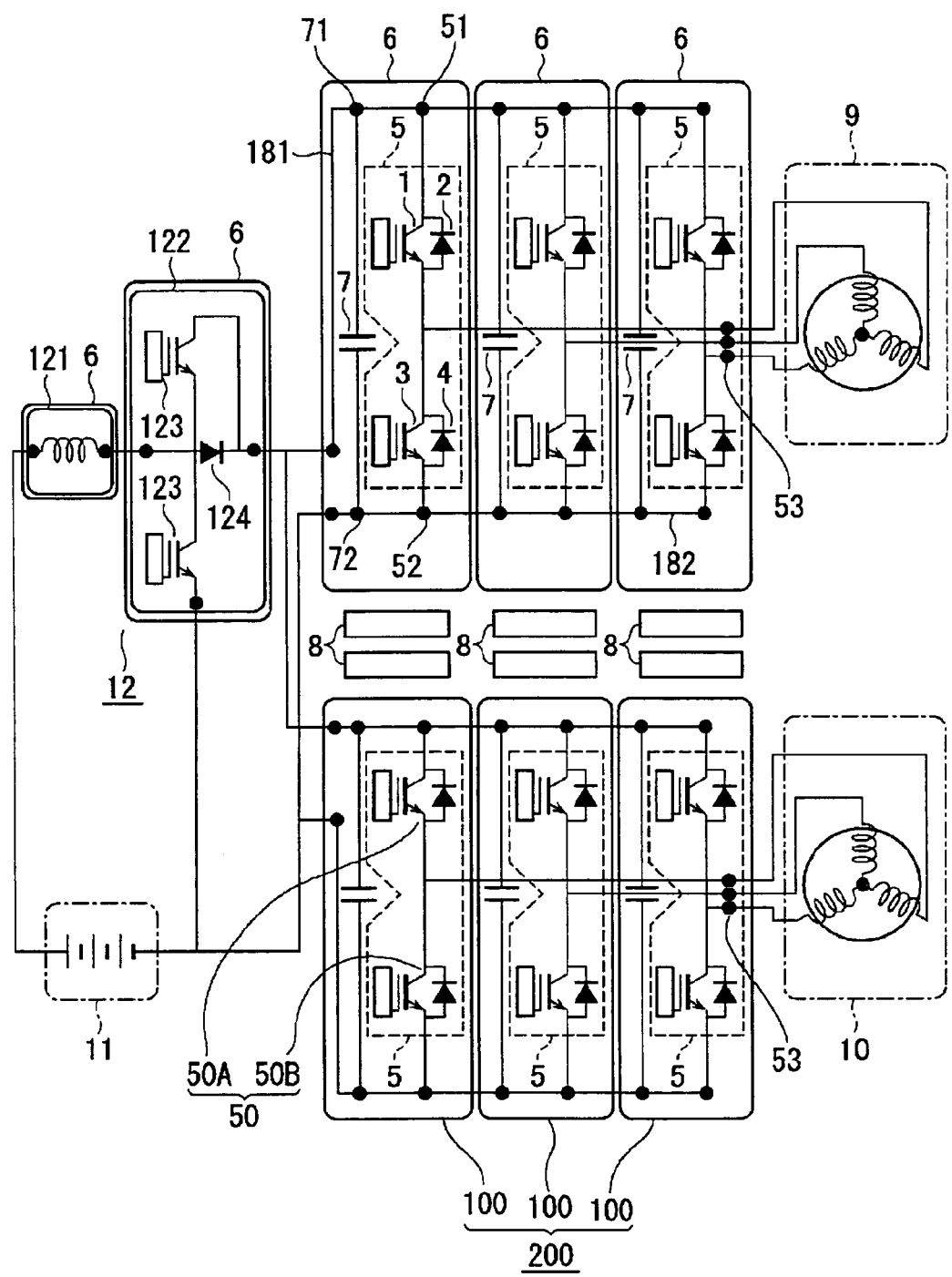
FIG. 2 is a schematic system view showing the internal construction of the power unit device shown in FIGS. 1A through 1C and a power converter device constructed to control two motors using six of these power unit devices.

FIG. 1 shows schematically the exterior of a power unit device according to a first preferred embodiment of the invention, FIG. 1A being a plan view, FIG. 1B a front view and FIG. 1C a side view. FIG. 2 is a schematic system view showing the internal construction of the power unit device shown in FIGS. 1A through 1C and a power converter device constructed to control a 3-phase a.c. rotary electric machine (hereinafter simply called a motor) using six of these power unit devices. The same reference numerals denote the same or equivalent parts throughout the figures.

In the figures, a power unit device 100 has a heat sink 6 having a first heat-receiving part 61 and formed on the opposite side from that a second heat-receiving part 62; a power module 5, in firm contact with the first heat-receiving part 61, containing a power semiconductor element 50 for performing DC-AC conversion (during power operation) and AC-DC conversion (during regenerative operation) for one phase; a smoothing condenser 7, in firm contact with the second heat-receiving part 62, for suppressing a ripple current of the power module; a holder 14 for holding a gate control circuit board 8; and a through bolt 16a and a nut 16b constituting fixing means 16 passing right through the smoothing condenser 7, the heat sink 6, the power module 5 and the holder 14 and integrating them.

The heat sink 6 is a box-shaped closed vessel made of a material having good thermal conductivity such as for example copper or aluminum, and in this example has nipples 63, 64 for a working fluid, for example a coolant liquid such as water or a water solution, to flow in to and out of the interior of the vessel through from outside. Insulating members 13 are disposed on the upper and lower faces in FIG. 1C of the smoothing condenser 7, and the smoothing condenser 7 is in firm contact with the heat sink 6 via the respective insulating member 13. The gate control circuit board 8 is fixed to the holder 14 using fixing screws 15. In FIG. 1A, the fixing screws, a circuit pattern and circuit parts are not shown.

The power module 5, the heat sink 6, the smoothing condenser 7, the insulating members 13 and the holder 14 each have a through hole (not shown) formed in their approximate center for the through bolt 16a to pass through. The through bolt 16a is screwed into the nut 16b, which is embedded, and sandwiches the power module 5, the heat sink 6, the smoothing condenser 7, the insulating members 13 and the holder 14 and integrates them in a state of firm contact (pressing contact) to make a power unit device 100 for one phase. When the holder 14 is metal, the nut 16b can be dispensed with by a screw thread for screwing onto the through bolt 16a being provided on the holder 14.

The power semiconductor element 50 contained in the power module 5, as shown with dashed lines in FIG. 2, is made up of a pair of power semiconductor elements 50A consisting of an IGBT 1 that functions during power operation and a flywheel diode 2 and another pair of power semiconductor elements 50B consisting of an IGBT 3 that functions during regenerative operation and a flywheel diode 4, and these two pairs of power semiconductor elements 50A, 50B are integrated and constitute a smallest unit with power and regeneration functions.

Main terminal connection parts 51, 52 to be connected to conducting members 181, 182 connected to the P pole and the N pole of a power supply battery 11, a connection part 53 to be connected to a motor 9, and a gate control signal terminal 54 to be connected to the gate control circuit board 8 are led out to outside. In FIG. 2, the gate control signal terminal 54 and a line connecting the gate control signal terminal 54 to the gate control circuit board 8 are not shown.

In the following, when there is no need to distinguish between the power semiconductor elements 50A, 50B, for convenience they will simply be called the power semiconductor elements 50.

In this first preferred embodiment, for each power module 5 the necessary smoothing condenser 7 and gate control circuit board 8 for controlling the gates of the IGBTs 1 and 3 are constructed integrally in the form of a unit with a single heat sink 6 to make a power unit device 100 for one phase, and two power converter devices 200 each made by connecting together three of these power unit devices 100 in parallel for three phases are used to control two motors 9, 10. The circuit constructions of the power converter devices 200 shown as examples in FIG. 2 are ones known in related art, and known technology can be used for them with no particular restrictions.

A DC-DC converter 12 for raising the voltage of the power supply battery 11 is provided between the power supply battery 11 and the power converter devices 200. The DC-DC converter 12 is constructed using an inductor 121, two high-frequency switches 123, and a commutation diode 124. The high-frequency switches 123 and the commutation diode 124 are mounted in the form of a power module 122 formed as a single package, and the inductor 121 and the power module 122 constituting the DC-DC converter 12 are also each cooled individually by a heat sink 6 like the power unit devices.

Connection parts 71, 72 connected to the two electrodes of the smoothing condenser 7 are joined by co-fastening to the conducting members 181, 182 together with the main terminal connection parts 51, 52, and connected in parallel to the P pole and the N pole of the power supply battery 11 by other conductors (not shown). The black dots (*) in FIG. 2 denote connections between the power modules 5 and the electrodes of the smoothing condensers 7 and the conducting members 181, 182, and here electrical continuity is achieved by for example screw fastening. The conducting members 181, 182 are in part held insulatingly by a molded resin and integrated to constitute a conductor member 18, and fixed (not shown) by a part of the molded resin to a side face part of the heat sink 6. The main terminal connection part 53 of the power module 5 for delivering power to the motor 9 or 10 is made to project from a side face of the power module 5.

Next, the operation of the first preferred embodiment constructed as described above will be explained. In the DC-DC converter 12 connected to the power supply battery 11, the high-frequency switches 123 are turned on and a current flows to the inductor 121 and accumulates energy there. The gate drives of these high-frequency switches 123 are ON/OFF-controlled by a control circuit not shown in the figures. Then, the high-frequency switches 123 are turned OFF and the energy accumulated in the inductor 121 passes through the commutation diode 124 and steps up the voltage to a required voltage. The reason for stepping up the voltage is that for the same electrical power raising the voltage makes it possible to reduce the current and lower the heat loss and so increase the efficiency of the power supply system.

The boosted voltage is fed to the power converter devices 200 for drive-controlling the two motors 9, 10. It is transmitted to the IGBTs 1, 3 for example as a PWM control signal by the gate control circuit boards 8 for controlling the IGBTs 1, 3 to produce a positive or negative torque or a forward or backward rotation speed required for the motors 9 and 10. As the IGBTs 1, 3 of the phases are repeatedly turned ON/OFF by this PWM control, a drift current of the current in the power conducting system arises and tends to reduce the life of the power supply battery 11. To suppress this drift current component, the smoothing condenser 7 is connected in parallel between the P and N electrodes of the power module 5, and the life of the power supply battery 11 is thereby extended.

Along with this operation, considerable heat is produced particularly by the power semiconductor elements 50 of the power module 5, but because the power module 5 itself is in firm contact or pressing contact with the first heat-receiving face 61 of the heat sink 6 and the smoothing condenser 7, which also produces heat, is in firm contact with the second heat-receiving face 62 on the opposite side of the heat sink 6, the heat is dissipated and both the power semiconductor elements 50 and the smoothing condenser 7 are kept below a predetermined allowable temperature.

As described above, with this first preferred embodiment, because in a power unit device 100 for one phase a smoothing condenser 7, a heat sink 6, a power module 5 and a holder 14 for holding a gate control circuit board 8 are integrated into a single unit with one through bolt 16a, power unit devices 100 for a required number of phases can be assembled in correspondence with an available space, assembly is easy, and the heat-sinking effect can be improved. And, because a heat sink 6 is mounted on each power module 5, size can be reduced, special measures of plant and labor at the time of assembly are unnecessary, the content of electrical equipment assembly of related art can be observed, and universality in the manufacturing aspect is excellent.

Second Preferred Embodiment

Figure 3:
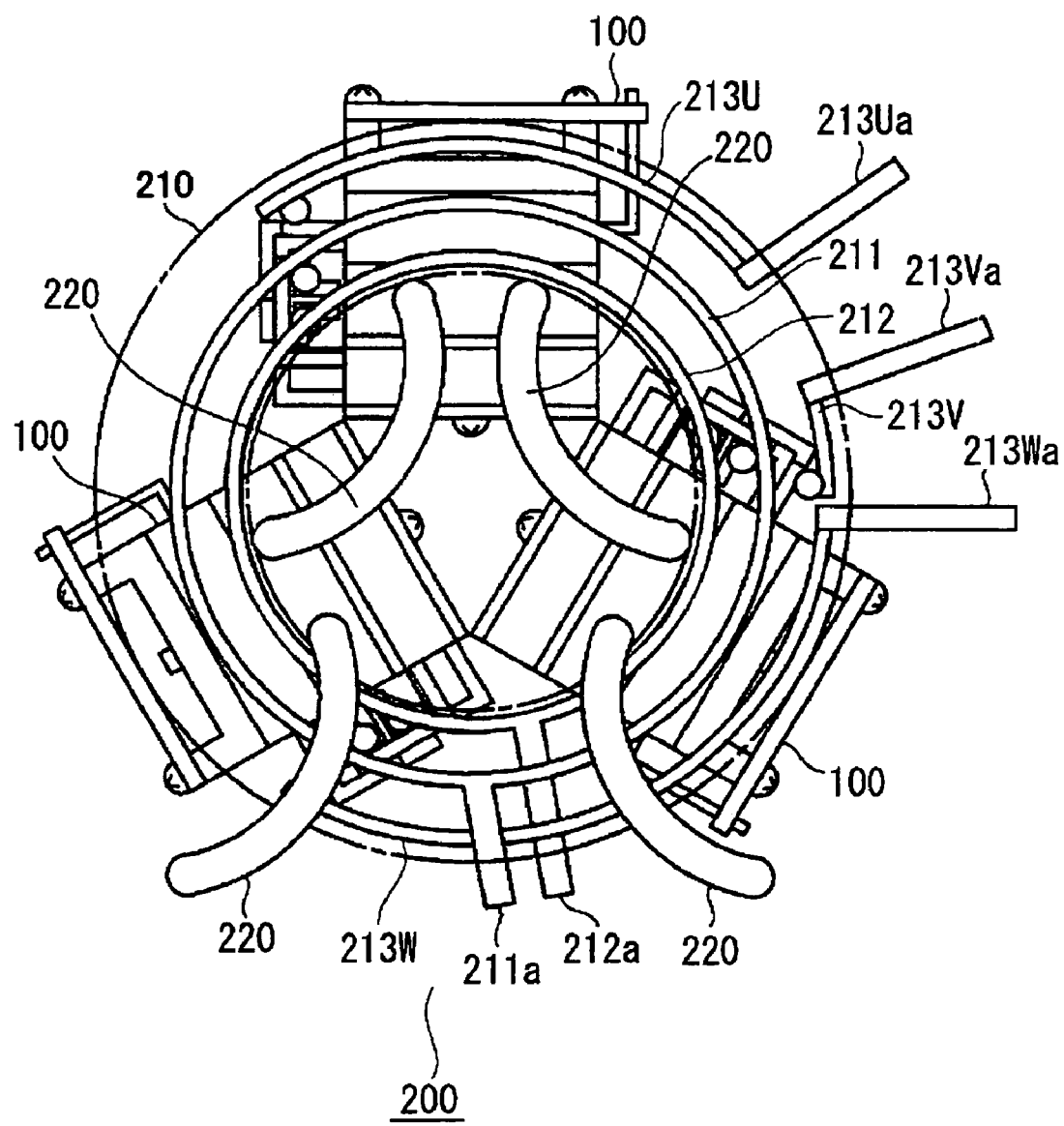
FIG. 3 is a construction view showing schematically a main part of a power converter device according to a second preferred embodiment of the invention.

FIG. 3 is a construction view showing schematically the main parts of a power converter device according to a second preferred embodiment of the invention. In this second preferred embodiment, three one-phase power unit devices 100 according to the first preferred embodiment shown in FIG. 1 are used to construct a power converter device for drive-controlling one 3-phase motor. In the figure, a power converter device 200 has three power unit devices 100 disposed radially with approximately uniform angular spacing, circular conductors 211, 212 are connected to conducting members (181, 182 in FIG. 1) of the power unit devices 100 by screw fastenings (not shown), and terminal parts 211a, 212a of the conductors 211, 212 are connected to the P pole and the N pole of a power supply battery (not shown).

Main terminal connection parts (53 of FIG. 1) for conducting power between the power unit devices 100 and the motor side are also connected to circular conductors 213U, 213V, 213W by screw fastenings (not shown), and terminal parts 213Ua, 213Va, 213Wa are connected to the coils of the motor 9 or 10 shown in FIG. 2. The conductors 211, 212, 213U, 213V, 213W are integrally held insulatingly by a molded resin to constitute a power conductor member 210 shown with broken lines, and the terminal parts 211a, 212a, 213Ua, 213Va, 213Wa are exposed. Also, the nipples (63, 64 in FIG. 1) of the heat sinks (6 in FIG. 1) of the power unit devices 100 are connected in series to the nipples of the adjacent power unit devices 100 by sections of a hose 220, the ends of the hose 220 are connected in the form of a loop to an external cooling water circuit containing a pump and a radiator (not shown), and a coolant (not shown) circulates through the insides of the heat sinks 6.

In the second preferred embodiment constructed as described above, besides the effects of the foregoing first preferred embodiment, as a result of a heat sink and a power module, which is a heat source, being in firm contact or pressing contact for each phase, the cooling effect is made uniform among the phases. And as a result of the power unit devices 100 being disposed in a circle with uniform angular spacing, as well as it being possible to make the power converter device 200 compact, the effect is obtained that the occurrence of surge voltage can also be made uniform among the phases. And, because a required number of power unit devices 100 can be combined in correspondence with the number of phases, the freedom of layout is increased.

Third Preferred Embodiment

Figure 4:
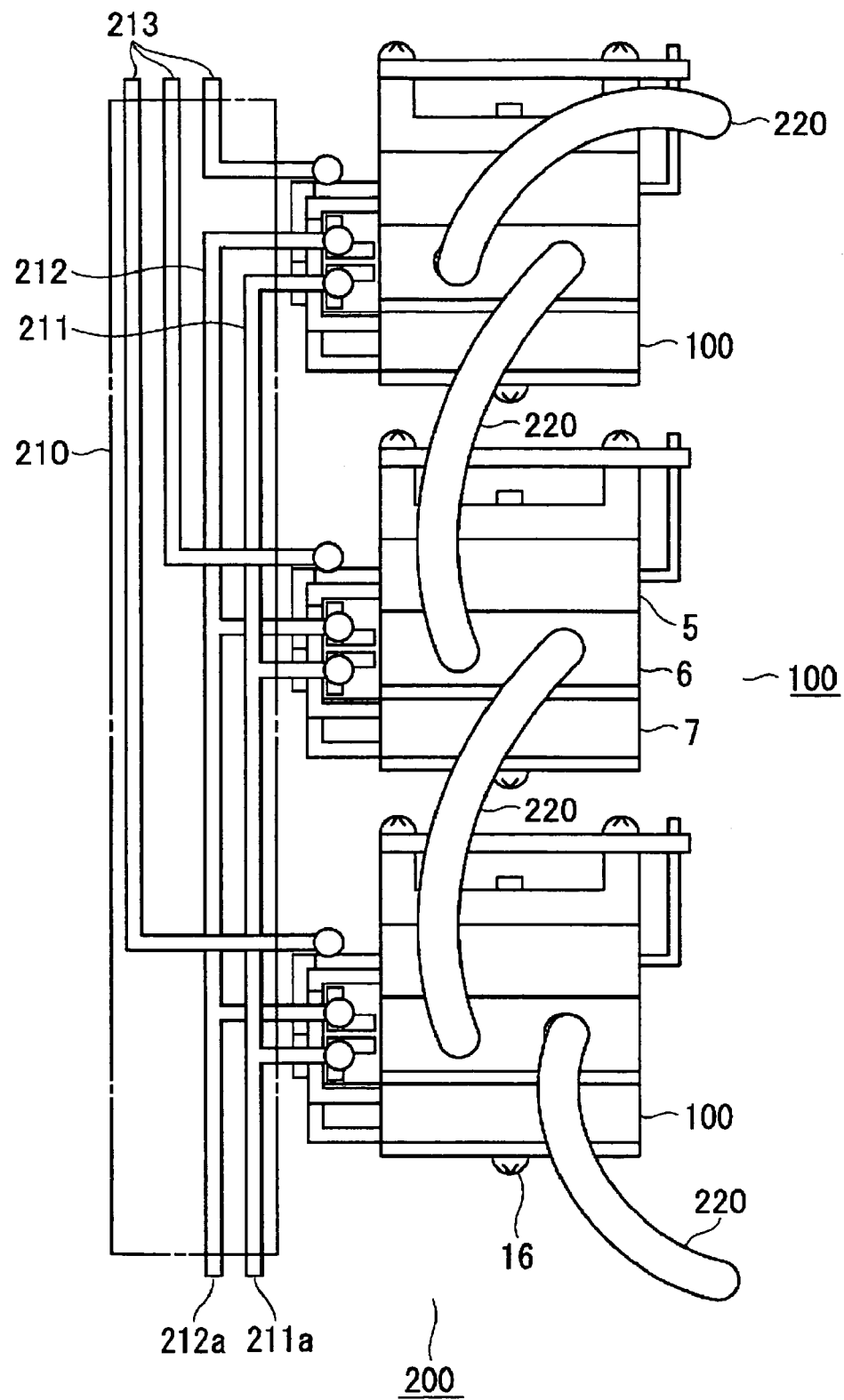
FIG. 4 is a construction view showing schematically a main part of a power converter device according to a third preferred embodiment of the invention.

FIG. 4 is a construction view showing schematically the main parts of a power converter device according to a third preferred embodiment of the invention. Whereas in the power converter device of the second preferred embodiment described above three of the power unit device shown in FIG. 1 were disposed in a circle with uniform angular spacing, in this third preferred embodiment three are disposed in a straight line. In the figure, the power unit devices 100 are disposed with approximately equal spacing in a straight line, and straight conductors 211, 212 of a P pole and an N pole connected to a power supply battery are connected to the conducting members of the power unit devices 100 (181, 182 in FIG. 1) by screw fastenings (not shown). The main terminal connection parts (53 of FIG. 1) for conducting power to the motor side of the power modules are also integrally embedded in a power conductor member 210 and connected by screw fastenings, and electrically connected to the motor 9 or 10.

And, the nipples (63, 64 in FIG. 1) of the heat sinks 6 of the power unit devices 100 are connected in series to the nipples of the adjacent power unit devices 100 by sections of a hose 220, the ends of the hose 220 are connected in the form of a loop to an external water circuit containing a pump and a radiator (not shown), and a coolant (not shown) circulates through the insides of the heat sinks 6.

In this third preferred embodiment constructed as described above, because a heat sink 6 is provided for each of the power modules 5, size can be reduced, special measures of plant and labor at the time of assembly are unnecessary, methods such as electrical equipment assembly lines of related art can be observed, and universality in the manufacturing aspect is excellent. Multiple power unit devices 100 can be mounted in correspondence with a required number of phases, they can be disposed in conformity with an available space, and the freedom of layout increases. Also, by the heat sinks 6 being in pressing contact with the power modules 5 individually, the cooling effect is made uniform among the phases, and by the power unit devices 100 being disposed with a uniform spacing, the occurrence of surge voltage can also be made uniform among the phases.

Although in the foregoing description of the preferred embodiments a single through bolt 16a and nut 16b were used as the fixing means 16 of the smoothing condenser 7, the heat sink 6 and the power module 5, the invention is not limited to this, and in cases such as when passing something through the center is problematic, they can be fixed at their peripheries, and in short any method effective in fixing them in firm contact or pressing contact will suffice. And although the gate control circuit board 8 was fixed integrally together with the smoothing condenser 7, the heat sink 6, the power module 5 by a holder 14, alternatively the gate control circuit board 8 may be made a separate construction.

Also, the foregoing second and third preferred embodiments are no more than single examples of power converter devices constructed using power unit devices 100 according to the invention, and of course their construction methods are not limited to these forms. And, the heat sink 6 may alternatively be a heat pipe for cooling by means of latent heat of evaporation. In this case, the nipples 63, 64 and the pump (not shown) and so on can be rendered unnecessary. And, although as the power semiconductor element 50 one having a total of two pairs of power semiconductor elements, containing a pair of power semiconductor elements 50A consisting of an IGBT 1 that functions during power operation and a flywheel diode 2 and another pair of power semiconductor elements 50B consisting of an IGBT 3 that functions during regenerative operation and a flywheel diode 4, the type and number of the power semiconductor elements is not limited to this, and for example depending on the application the same effects can be expected with one containing either one of these pairs of power semiconductor elements. Various other variations and changes are of course possible within the scope of the invention.

What is claimed is:

1. A power unit device, comprising:
   a heat sink having first and second heat-receiving surfaces on opposing sides thereof;
   a power module, disposed on the first heat-receiving surface, containing a power semiconductor element for performing DC-AC conversion and/or AC-DC conversion for one phase;

a smoothing condenser, disposed on the second heat-receiving surface, for suppressing ripple current of the power semiconductor element; and fixing means for holding the power module, the heat sink and the smoothing condenser together, wherein the fixing means comprises a through element that passes through at least one of the power module, the smoothing condenser, and the heat sink.

2. A power unit device comprising:

a heat sink having first and second heat-receiving surfaces on opposing sides thereof;

a power module, disposed on the first heat-receiving surface, containing a power semiconductor element for performing DC-AC conversion and AC-DC conversion for one phase;

a smoothing condenser, disposed on the second heat-receiving surface, for suppressing ripple current of the power semiconductor element; and fixing means for holding the power module, the heat sink and the smoothing condenser together;

wherein the fixing means comprises a through bolt that passes through the approximate centers of the power module, the heat sink and the smoothing condenser.

3. A power unit device comprising:

a heat sink having first and second heat-receiving surfaces on opposing sides thereof;

a power module, disposed on the first heat-receiving surface, containing a power semiconductor element for performing DC-AC conversion and/or AC-DC conversion for one phase;

a smoothing condenser, disposed on the second heat-receiving surface, for suppressing ripple current of the power semiconductor element;

fixing means for holding the power module, the heat sink and the smoothing condenser together; and a gate control circuit board for controlling the power semiconductor element and a holder for holding the gate control circuit board, wherein the fixing means connects the holder with a face of the power module on the opposite side thereof from the heat sink.

4. A power unit device according to claim 2, further comprising a gate control circuit board for controlling the power semiconductor element and a holder for holding the gate control circuit board, wherein the fixing means connects the holder with a face of the power module on the opposite side thereof from the heat sink.

5. A power unit device according to claim 1, wherein the heat sink comprises a box-shaped vessel formed so that a working fluid can pass through its interior.

6. A power unit device according to claim 2, wherein the heat sink comprises a box-shaped vessel formed so that a working fluid can pass through its interior.

7. A power unit device according to claim 2, wherein the heat sink comprises a box-shaped vessel formed so that a working fluid can pass through its interior.

8. A power unit device according to claim 4, wherein the heat sink comprises a box-shaped vessel formed so that a working fluid can pass through its interior.

9. A power converter device wherein a number corresponding to a control object of power unit devices according to claim 1 are used and disposed in a circle with approximately uniform angular spacing.

10. A power converter device wherein a number corresponding to a control object of power unit devices according to claim 2 are used and disposed in a circle with approximately uniform angular spacing.

11. A power converter device wherein a number corresponding to a control object of power unit devices according to claim 3 are used and disposed in a circle with approximately uniform angular spacing.

12. A power converter device wherein a number corresponding to a control object of power unit devices according to claim 5 are used and disposed in a circle with approximately uniform angular spacing.

13. A power converter device wherein a number corresponding to a control object of power unit devices according to claim 7 are used and disposed in a circle with approximately uniform angular spacing.

14. A power converter device wherein a number corresponding to a control object of power unit devices according to claim 1 are used and disposed in a straight line with an approximately uniform spacing.

15. A power converter device wherein a number corresponding to a control object of power unit devices according to claim 2 are used and disposed in a straight line with an approximately uniform spacing.

16. A power converter device wherein a number corresponding to a control object of power unit devices according to claim 3 are used and disposed in a straight line with an approximately uniform spacing.

17. A power converter device wherein a number corresponding to a control object of power unit devices according to claim 5 are used and disposed in a straight line with an approximately uniform spacing.

18. A power converter device wherein a number corresponding to a control object of power unit devices according to claim 7 are used and disposed in a straight line with an approximately uniform spacing.

* * * * *